(12) United States Patent
Rhodes

(10) Patent No.: US 6,852,591 B2
(45) Date of Patent: Feb. 8, 2005

(54) METHOD OF FORMING CMOS IMAGER WITH STORAGE CAPACITOR

(75) Inventor: Howard E. Rhodes, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 44 days.

(21) Appl. No.: 10/132,273

(22) Filed: Apr. 26, 2002

(65) Prior Publication Data

US 2002/0117690 A1 Aug. 29, 2002

Related U.S. Application Data

(62) Division of application No. 09/725,468, filed on Nov. 30, 2000, which is a division of application No. 09/352,947, filed on Jul. 14, 1999.

(51) Int. Cl.[7] .......................................... H01L 21/8242
(52) U.S. Cl. ........................ 438/244; 438/60; 438/239; 438/241; 438/243
(58) Field of Search .......................... 438/60, 77, 201, 438/239, 241, 243, 244, 253, 387, 396

(56) References Cited

U.S. PATENT DOCUMENTS

| | | |
|---|---|---|
| 4,051,374 A | 9/1977 | Drexhage et al. |
| 4,236,831 A | 12/1980 | Hendrickson |
| 4,262,297 A | 4/1981 | Partridge |
| 4,309,624 A | 1/1982 | Hynecek et al. |
| 4,319,261 A | 3/1982 | Kub |
| 4,374,700 A | 2/1983 | Scott et al. |
| 4,605,849 A | 8/1986 | Kliem et al. |
| 4,700,459 A | 10/1987 | Peek |
| 4,910,570 A | 3/1990 | Popovic |
| 5,029,189 A | 7/1991 | Sato et al. |
| 5,151,385 A | 9/1992 | Yamamoto et al. |
| 5,319,604 A | 6/1994 | Imondi et al. |
| 5,360,751 A * | 11/1994 | Lee .............................. 437/35 |
| 5,393,997 A | 2/1995 | Fukusho et al. |
| 5,461,425 A | 10/1995 | Fowler et al. |
| 5,471,515 A | 11/1995 | Fossum et al. |
| 5,506,429 A | 4/1996 | Tanaka et al. |
| 5,541,402 A | 7/1996 | Ackland et al. |
| 5,576,763 A | 11/1996 | Ackland et al. |
| 5,608,243 A | 3/1997 | Chi et al. |
| 5,612,799 A | 3/1997 | Yamazaki et al. |
| 5,614,744 A | 3/1997 | Merrill |
| 5,625,210 A | 4/1997 | Lee et al. |
| 5,705,846 A | 1/1998 | Merrill |
| 5,708,263 A | 1/1998 | Wong |
| 5,747,840 A | 5/1998 | Merrill |
| 5,757,045 A | 5/1998 | Tsai et al. |
| 5,760,458 A | 6/1998 | Bergemont et al. |
| 5,838,176 A * | 11/1998 | Delbruck et al. .............. 327/95 |
| 5,929,489 A | 7/1999 | Deane |
| 6,021,172 A * | 2/2000 | Fossum et al. ................ 377/60 |
| 6,069,376 A | 5/2000 | Merrill |
| 6,084,261 A * | 7/2000 | Wu .............................. 257/309 |
| 6,188,056 B1 * | 2/2001 | Kalnitsky et al. ......... 250/208.1 |
| 6,204,524 B1 | 3/2001 | Rhodes |
| 6,410,397 B1 * | 6/2002 | Ochiai et al. ................ 438/381 |

OTHER PUBLICATIONS

Dickinson, A., et al., *A 256x256 CMOS Active Pixel Image Sensor with Motion Detection*, 1995 IEEE International Solid–State Circuits Conference, pps. 226–227.

(List continued on next page.)

*Primary Examiner*—Amir Zorabian
*Assistant Examiner*—Pamela E Perkins
(74) *Attorney, Agent, or Firm*—Dickstein Shapiro Morin & Oshinsky LLP

(57) ABSTRACT

A CMOS imager having an improved signal to noise ratio and improved dynamic range is disclosed. The CMOS imager provides improved charge storage by fabricating a storage capacitor in parallel with the photocollection area of the imager. The storage capacitor may be a flat plate capacitor formed over the pixel, a stacked capacitor or a trench imager formed in the photosensor. The CMOS imager thus exhibits a better signal-to-noise ratio and improved dynamic range. Also disclosed are processes for forming the CMOS imager.

50 Claims, 14 Drawing Sheets

OTHER PUBLICATIONS

Dickinson, A., et al., *Standard CMOS Active Pixel Iamge Sensors for Multimedia Applications*, Proceedings of Sixteenth Conference on Advanced Research in VLSI, Mar. 27–29, 1995, pps. 214–224.

Eid, E–S., et al., *A 256 ×256 CMOS Active Pixel Image Sensor*, Proc. SPIE vol. 2415, Apr. 1995, pps. 265–275.

Fossum, E., *CMOS Image Sensors: Electronic Camera On A Chip*, 1995 IEEE, pps. 17–25.

Fossum, E., et al., *IEDM A 37×28mm² 600k–Pixel CMOS APS Dental X–Ray Camera–on–a–Chip with Self–Triggered Readout* 1998 IEEE International Solid–State Circuits Conference, pps. 172–173.

Fossum, E., *Low Power Camera–on–a–Chip Using CMOS Active Pixel Sensor Technology*, 1995 IEEE, pps. 74–77.

Fossum, E., *Architectures for focal plane image processing*, Optical Engineering, vol. 28, No. 8, Aug. 1989, pps. 865–871.

Janesick, J., et al., *New advancements in charge–coupled device technology—sub–electron noise and 4096×4096 pixel CCDs*, Proc. SPIE vol. 1242, 1990, pps. 223–237.

Kemeny, S.E., et al., *Update on focal–plane image processing research*, Proc. SPIE vol. 1447, 1991, pps. 243–250.

Mendis, S., et al., *CMOS Active Pixel Image Sensor*, IEEE Transactions on Electron Devices, vol. 41, No. 3, Mar. 1994, pps. 452–453.

Mendis, S.K., et al., *A 128 ×128 CMOS Active Pixel Image Sensor for Highly Integrated Imaging Systems*, 1993 IEEE, pps. 583–586.

Mendis, S.K., et al., *CMOS Active Pixel Image Sensors for Highly Integrated Imaging Systems*, IEEE Journal of Solid–State Circuits, vol. 32, No. 2, Feb. 1997, pps. 187–197.

Mendis, S.K., et al., *Design of a Low–Light–Level Image Sensor with On–Chip Sigma–Delta Analog–to–Digital Conversion*, Proc. SPIE vol. 1900, Jul. 1993, pps. 31–39.

Mendis, S.K., et al., *Low–Light–Level Image Sensor with On–Chip Signal Processing*, Proc. SPIE vol. 1952, Nov. 1993, pps. 23–33.

Mendis, S.K., et al., *Progress In CMOS Active Pixel Image Sensors*, Proc. SPIE vol. 2172, May 1994, pps. 19–29.

Nakamura, J., et al., *CMOS Active Pixel Image Sensor with Simple Floating Gate Pixels*, IEEE Transactions on Electron Devices, vol. 42, No. 9, Sep. 1995, pps. 1693–1694.

Nixon, R.H., et al., *256 ×256 CMOS Active Pixel Sensor Camera–on–a–Chip*, IEEE Journal of Solid–State Circuits, vol. 31, No. 12, Dec. 1996, pps. 2046–2050.

Nixon, R.H., et al., *256×256 CMOS Active Pixel Sensor Camera–on–a–Chip*, 1996 IEEE International Solid–State Circuits Conference, pps. 178–179.

Panicacci, R., et al., *Programmable multiresolution CMOS active pixel sensor*, Proc. SPIE vol. 2654, Mar. 1996, pps. 72–79.

Panicacci, R.A., et al., *128Mb/s Multiport CMOS Binary Active–Pixel Image Sensor*, 1996 IEEE International Solid–State Circuit Conference, pps. 100–101.

Yadid–Pecht, O., et al., *CMOS Active Pixel Sensor Star Tracker with Regional Electronic Shutter*, IEEE Journal of Solid–State Circuits, vol. 32, No. 2, Feb. 1997, pps. 285–288.

Yadid–Pecht, O., et al., *Wide dynamic range APS star tracker*, Proc. SPIE vol. 2654, Mar. 1996, pps. 82–92.

Zarnowski, J., et al., *Imaging options expand with CMOS technology*, Laser Focus World, Jun. 1997, pps. 125–130.

Zhou, Z., et al., *A Cmos Imager with On–Chip Variable Resolution for Light–Adaptive Imaging*, 1998 IEEE International Solid–State Circuits Conference, pps. 174–175.

Zhou, Z., et al., *A Digital CMOS Active Pixel Image Sensor For Multimedia Applications*, Proc. SPIE vol. 2894, Sep. 1996, pps. 282–288.

* cited by examiner

METHOD OF FORMING CMOS IMAGER WITH STORAGE CAPACITOR

This application is a divisional of application Ser. No. 09/725,468, filed on Nov. 30, 2000 now U.S. Pat. No. 6,429,470, which is a divisional of Ser. No. 09/352,947, filed on Jul. 14, 1999 now U.S. Pat. No. 6,204,524, which is hereby incorporated by reference.

FIELD OF THE INVENTION

The invention relates generally to improved semiconductor imaging devices and in particular to an imaging device which can be fabricated using a standard CMOS process. Particularly, the invention relates to a CMOS imager having a storage capacitor formed in parallel with a light sensitive node of the CMOS imager.

BACKGROUND OF THE INVENTION

There are a number of different types of semiconductor-based imagers, including charge coupled devices (CCDs), photodiode arrays, charge injection devices and hybrid focal plane arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image tag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a pliotogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS, e.g. 0 volts. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS-VOUTR) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD-Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage TX, similar to the reset pulse RST, is then applied to transfer gate 28 of transistor 29 to cause the charge in n+region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17–25 (1995) as well as other publications. These references are incorporated herein by reference.

Prior CMOS imagers suffer from poor signal to noise ratios and poor dynamic range as a result of the inability to fully collect and store the electric charge collected by the photosensitive area. Since the size of the pixel electrical signal is very small due to the collection of photons in the photo array, the signal to noise ratio and dynamic range of the pixel should be as high as possible. There is needed, therefore, an improved active pixel photosensor for use in an APS imager that exhibits improved dynamic range, a better signal-to-noise ratio, and improved charge capacity for longer integration times. A method of fabricating an active pixel photosensor exhibiting these improvements is also needed.

SUMMARY OF THE INVENTION

The present invention provides a CMOS imager having a storage capacitor connected to the light sensitive node to improve collected charge storage. The storage capacitor is formed in parallel with the light sensitive node of the imager and may be any type of capacitor formed on the pixel cell over a non-light sensitive area. Also provided are methods for forming the CMOS imager of the present invention.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 5:
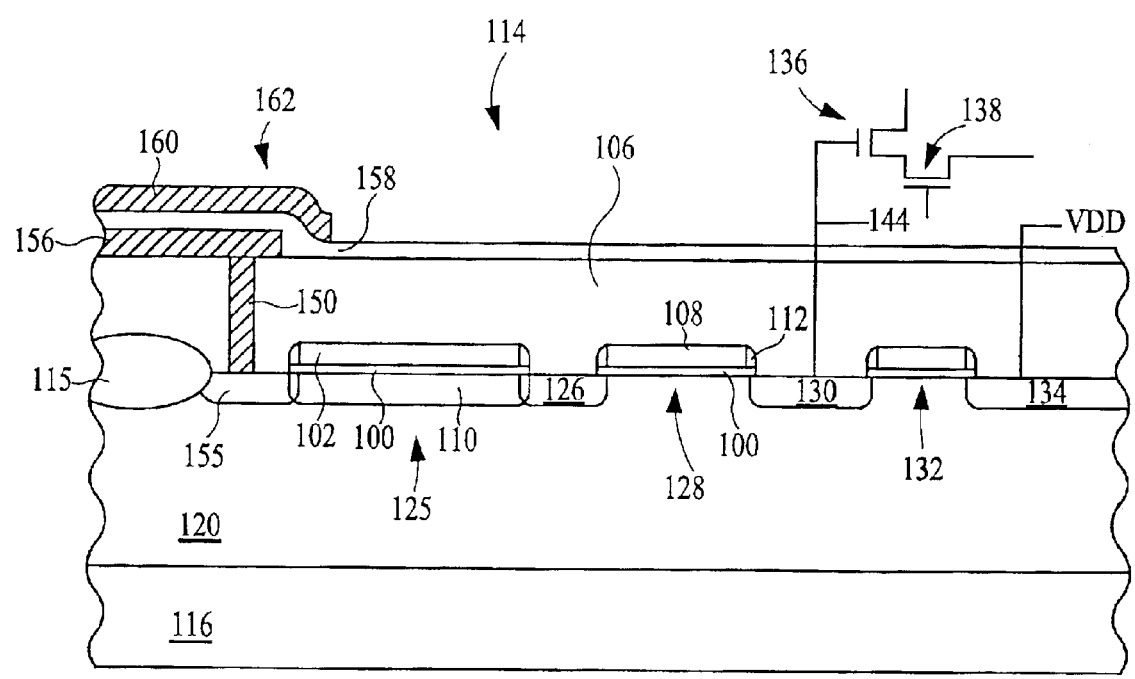
FIG. 5 is a cross-sectional view of a pixel sensor according to one embodiment of the present invention.

The structure of the pixel cell 114 of a first embodiment is shown in more detail in FIG. 5. The pixel cell 114 may be formed in a substrate 116 having a doped layer 120 of a first conductivity type, which for exemplary purposes is treated as a p-type substrate. A field oxide layer 115, which serves to surround and isolate the cells may be formed by thermal oxidation of the doped layer 120, or by chemical vapor deposition of an oxide material. This field oxide layer 115 may be formed before or after the gate stacks (described below) are formed. The doped layer 120 is provided with five doped regions 110, 126, 130, 134 and 155, which are doped to a second conductivity type, which for exemplary purposes is treated as n type. The first doped region 110 underlies photogate 102, which is a thin layer of material transparent to radiant energy, such as polysilicon. The second doped region 126 electrically connects photogate transistor 125 to the transfer transistor gate 128. An insulating layer 100 of silicon dioxide, silicon nitride, or other suitable material is formed over a surface of the doped layer 120 of the substrate 116.

Figure 1:
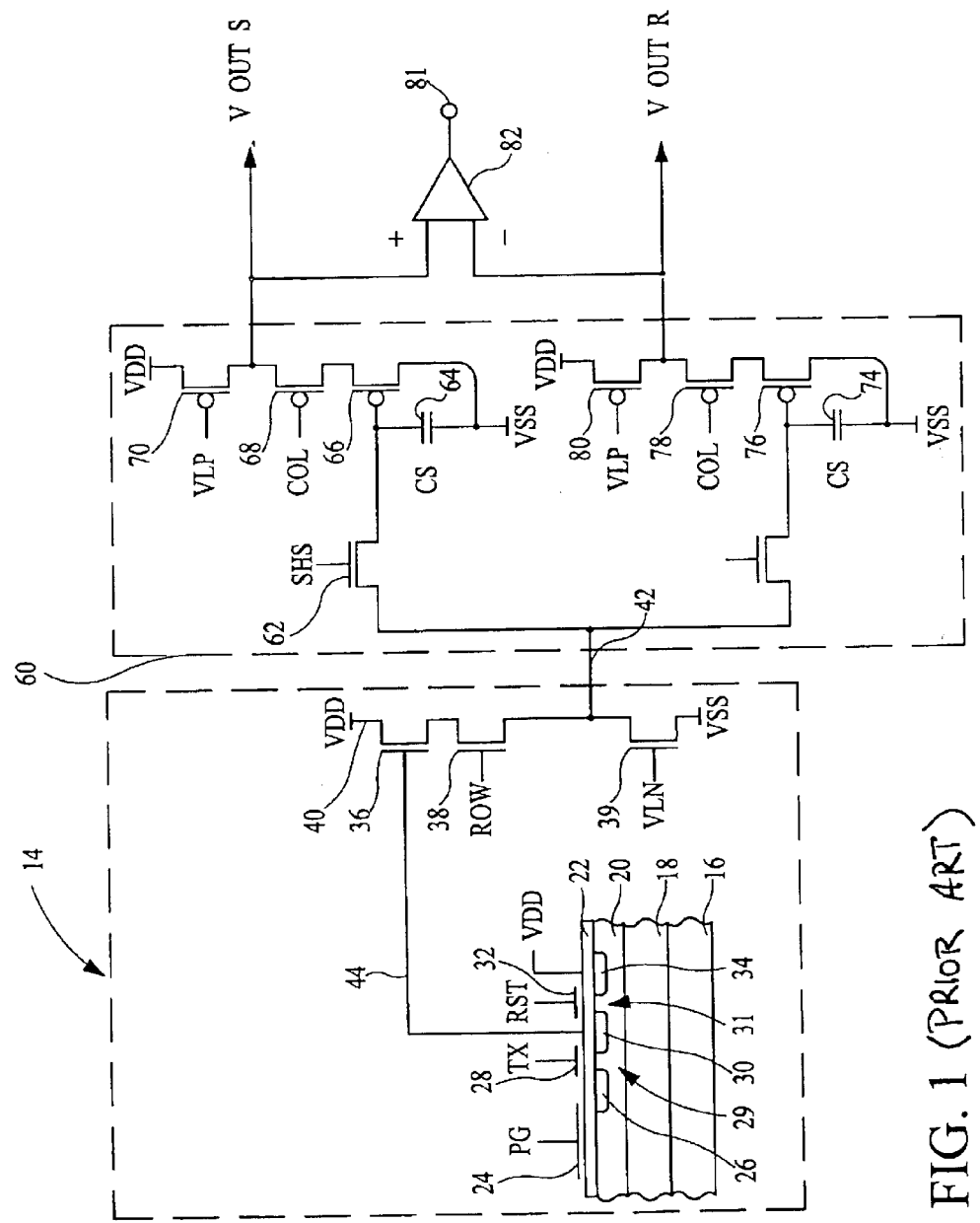
FIG. 1 is a representative circuit of a CMOS imager.
Figure 2:
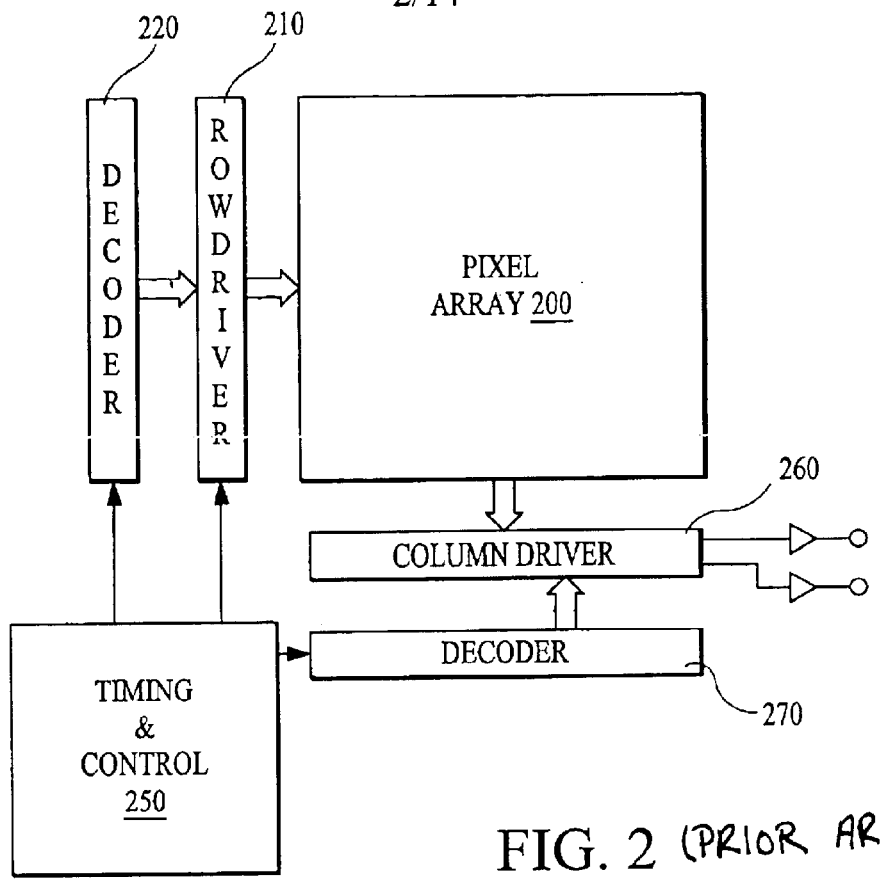
FIG. 2 is a block diagram of a CMOS pixel sensor chip.
Figure 3:
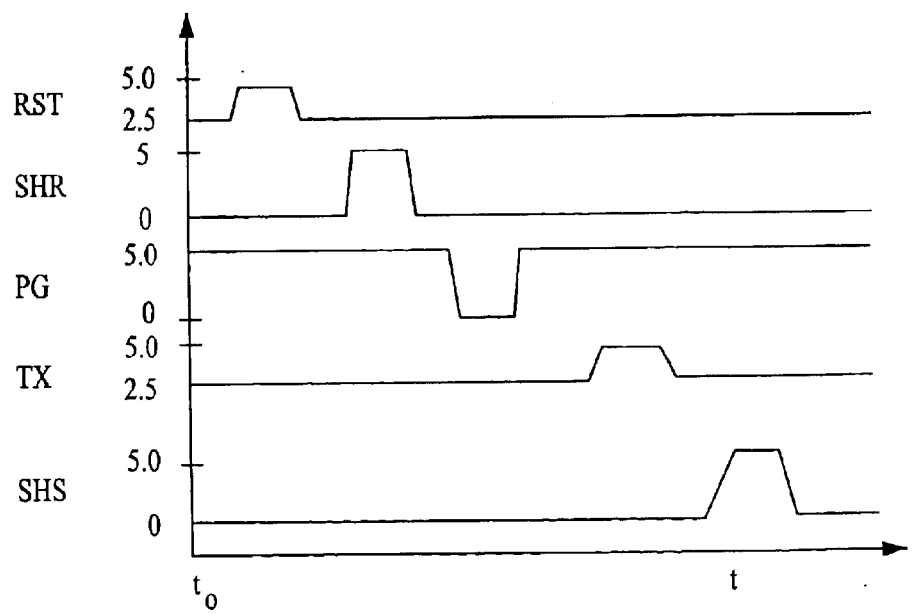
FIG. 3 is a representative timing diagram for the CMOS imager.
Figure 4:
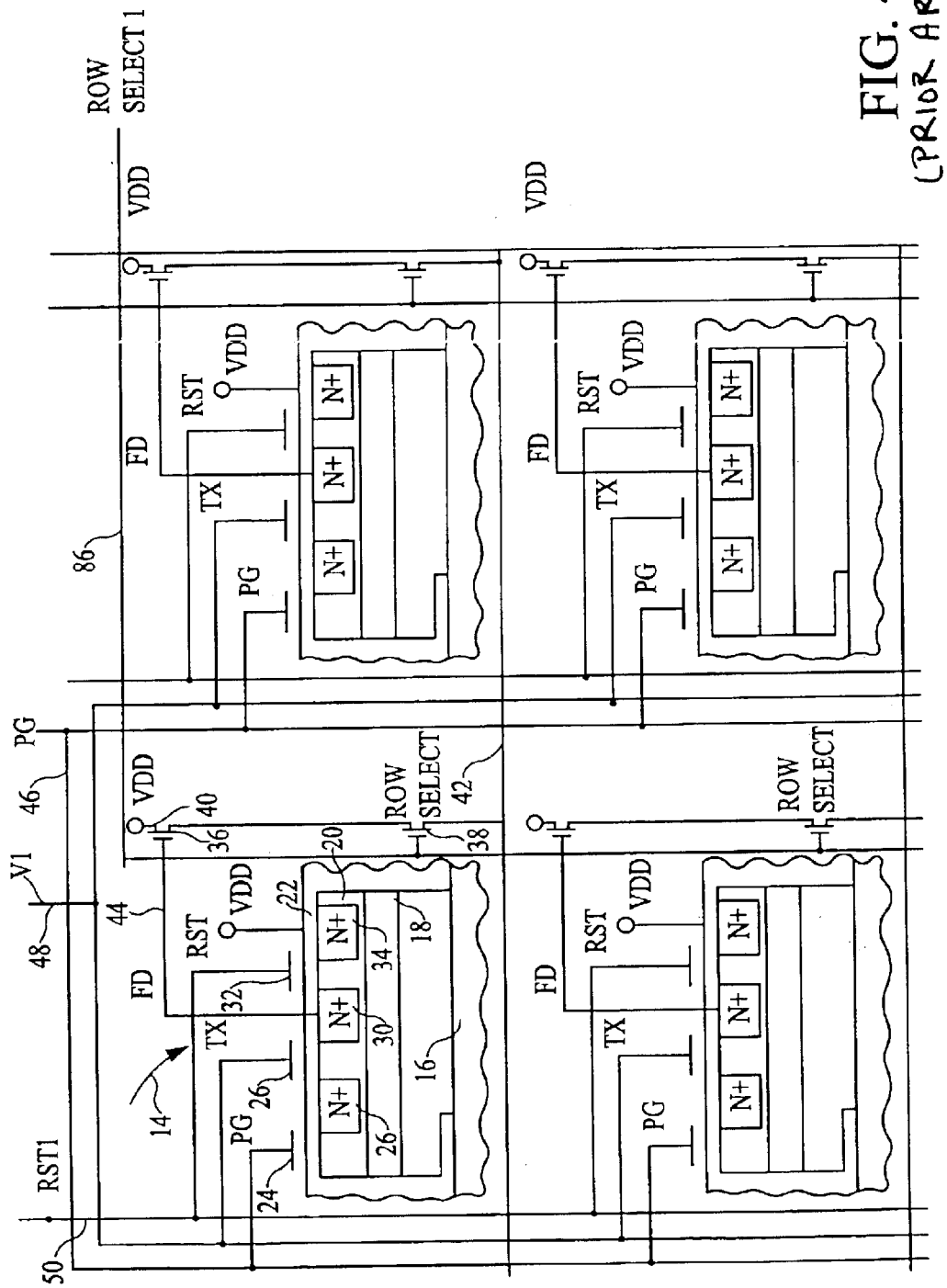
FIG. 4 is a representative pixel layout showing a 2×2 pixel layout.

The third doped region 130 is the floating diffusion region, sometimes also referred to as a floating diffusion node. The floating diffusion region 130 is connected to the source follower transistor 136 by a contact line 144 which is typically a metal contact line. The source follower transistor 136 outputs a signal proportional to the charge accumulated in the floating diffusion region 130 to a readout circuit 60 when the row select transistor 138 is turned on as shown above in FIG. 1. While the source follower transistor 136 and transistor 138 are illustrated in FIG. 5 in circuit form above substrate 120, it should be understood that these transistors are typically formed in substrate 120 in a similar fashion to transistors 128 and 132.

The fourth doped region 134 is the drain of the reset transistor 132, and is also connected to voltage source VDD. The pixel cell thus far described with reference with FIG. 5 operates in a manner similar to the pixel cell described above with reference to FIGS. 1–4 in terms of collecting and reading out charges to the readout circuit 60. In addition, FIG. 5 also shows a fifth doped region 155 which is formed adjacent to the photogate 102 and serves to transfer charge to a storage capacitor 162 from the photosensitive area under the photogate by contact 150.

One means of forming the storage capacitor 162 is shown in FIG. 5. The storage capacitor 162 is formed over the substrate 116 as described below. An insulating layer 106 is formed over the substrate containing the pixel cell active area, including the photogate and the pixel transistors. The insulating layer 106 may be formed of BPSG (borophosphorosilicate glass), BSG (borosilicate glass), PSG (phosphorosilicate glass), USG (undoped silicate glassy or the like as described further below provided that the material does not block light to the photosensor (in the illustrated embodiment, this is a photogate). A portion of the insulating layer 106 is etched away to form a conduit which is filled with conductive material forming a contact 150. Contact 150 connects the region 155 which is coupled to the charge accumulation area under the photogate 102 to a first electrode 156 of storage capacitor 162. The storage capacitor 162 is illustrated in FIG. 5 as a planar plate capacitor. The storage capacitor 162 has first electrode 156, a second electrode 160, and a dielectric layer 158 formed therebetween. Second electrode 160 is preferably connected to a ground potential source. The storage capacitor 162 is formed such that it does not block the photosensitive area of the imager. As shown in FIG. 5, the storage capacitor 162 overlies at least a portion of the field oxide 115; however, it should be understood that the storage capacitor 162 may be formed over any non-photosensitive area, such as, for example, over the transfer gate 128, the reset gate 132, the source follower transistor 136, or the row select transistor 138 where the capacitor would additionally and advantageously also function as a light shield.

Figure 6:
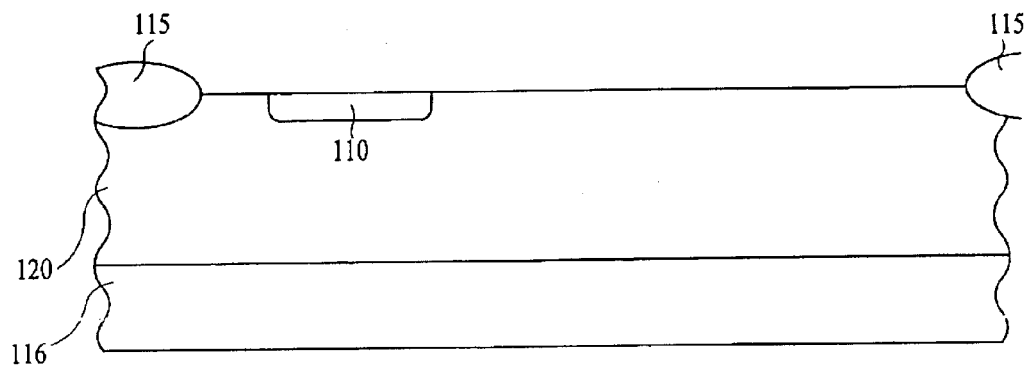
FIG. 6 is a cross-sectional view of a semiconductor wafer according to FIG. 5 undergoing the process of an embodiment of the invention.

The CMOS imager illustrated in FIG. 5 is fabricated by a process described as follows, and illustrated by FIGS. 6 through 14. Referring now to FIG. 6, a substrate 116, which may be any of the types of substrates described above, is doped to form a doped substrate layer 120 of a first conductivity type, which for exemplary purposes will be described as p-type. The substrate layer 120 is masked and doped region 110 is formed in the substrate 120. Any suitable doping process may be used, such as ion implantation.

Figure 7:
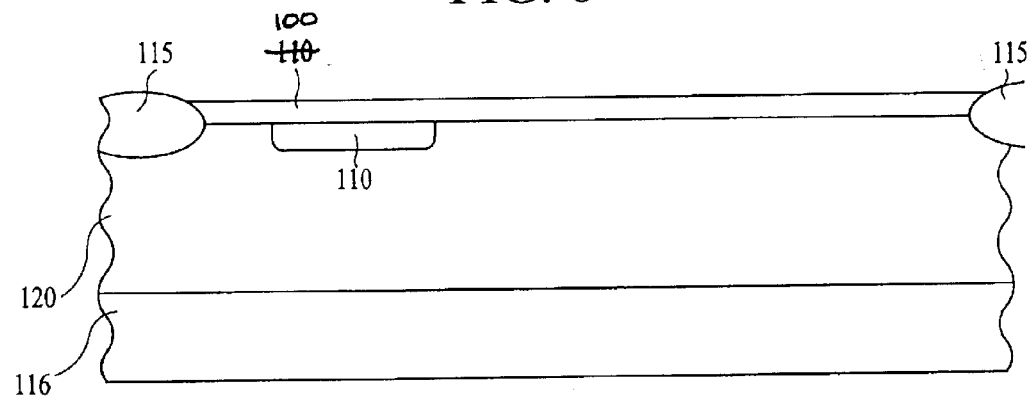
FIG. 7 shows the wafer of FIG. 6 at a processing step subsequent to that shown in FIG. 6.

Referring now to FIG. 7, an insulating layer 100 is now formed over the substrate 116 by thermal growth or chemical vapor deposition, or other suitable means. The insulating layer 100 may be of silicon dioxide, silicon nitride, or other suitable insulating material, and has a thickness of approximately 2 to 100 nm. It is formed to completely cover the substrate 116, and to extend to the field oxide layer 115.

Figure 8:
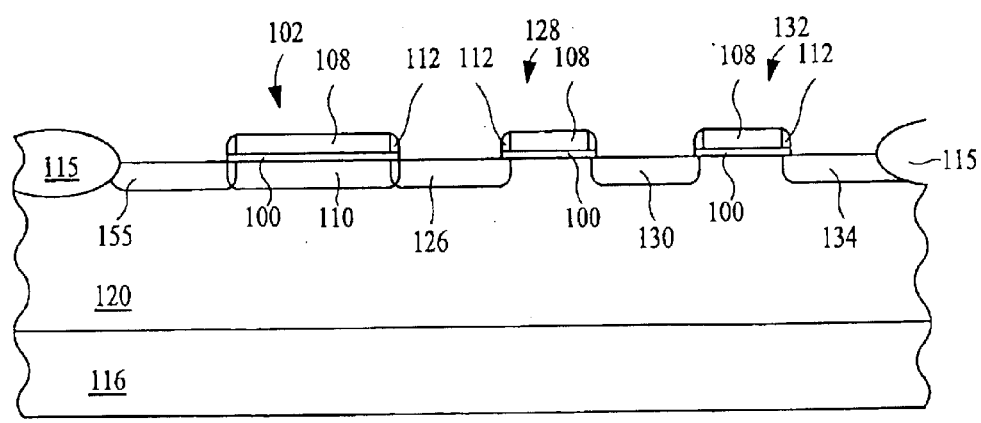
FIG. 8 shows the wafer of FIG. 6 at a processing step subsequent to that shown in FIG. 7.

Referring now to FIG. 8, the transfer gate stack 128, reset transistor gate stack 132, and photogate 102 are now formed. The photogate 102 includes silicon dioxide or silicon nitride insulator 100 on the doped layer 120 and a conductive layer 108 over the insulating layer. Conductive layer 108 is formed of a doped polysilicon or other transparent conductors. The thickness of the conductive layer 108 in photogate 102 may be any suitable thickness, e.g., approximately 200 to 5000 Angstroms.

Conductive layers 108 in gates 128 and 132 may be formed of doped polysilicon, a refractory metal silicide such as tungsten, tantalum, or titanium silicides or other suitable materials such as a barrier/metal. The conductive material is formed by CVD or other suitable means. A silicide or barrier/metal layer (not shown) may be used as part of the polysilicon layer, if desired. The gate stacks may be formed by applying layers 108 (and a silicide layer, if used) over the substrate and then etching them to form gate stacks 102, 128 and 132. Insulating sidewalls 112 are also formed on the sides of the gate stacks 102, 128, 132. These sidewalls may be formed of, for example, silicon dioxide, silicon nitride, or ONO. While these gate stacks may be formed before or after the process of the photogate 102 described below, for exemplary purposes and for convenience the photogate formation has been described as occurring during transistor gate stack formation.

After spacer formation 112, doped regions 126, 130, 134 and 155 are then formed in the doped layer 120. Any suitable doping process may be used, such as ion implantation. A resist and mask (not shown) are used to shield areas of the layer 120 that are not to be doped. Four doped regions are formed in this step: doped region 126, which forms a transfer region; doped region which is floating diffusion region 130 (which connects to the source follower transistor 136 by contact 144 as shown in FIG. 5); doped region which is a drain region 134; and doped region 155 which serves to connect the photocollection area with the storage capacitor 162. The doped regions 126, 130, 134 and 155 are doped to a second conductivity type, which for exemplary purposes will be considered to be n-type. Several masks may be used to implant the regions 126, 130, 134 and 155 to the same or different doping concentrations. Preferably, the doped regions 126, 130, 134 and 155 are heavily n-doped with arsenic, antimony or phosphorous at a dopant concentration level of from about $1 \times 10^{15}$ ions/cm$^2$ to about $1 \times 10^{16}$ ions/cm$^2$.

Figure 9:
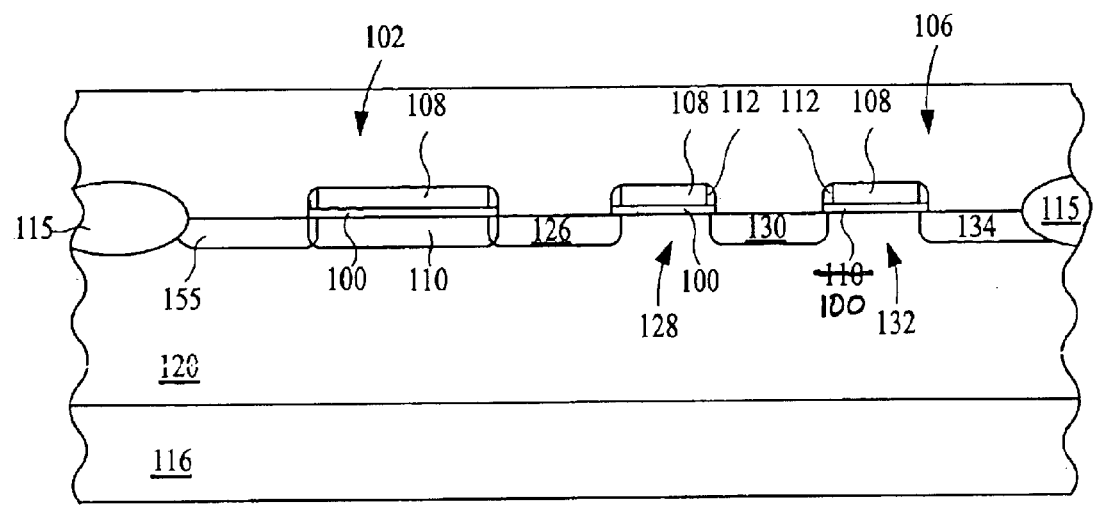
FIG. 9 shows the wafer of FIG. 6 at a processing step subsequent to that shown in FIG. 8.

Reference is now made to FIG. 9. The photosensor cell is essentially complete at this stage, and conventional processing methods may now be used to form contacts and wiring to connect gate lines and other connections in the pixel cell. The entire surface of the substrate 116 is covered with an insulating layer 106 of, e.g., silicon dioxide, USG, BPSG, PSG, BSG or the like which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 10:
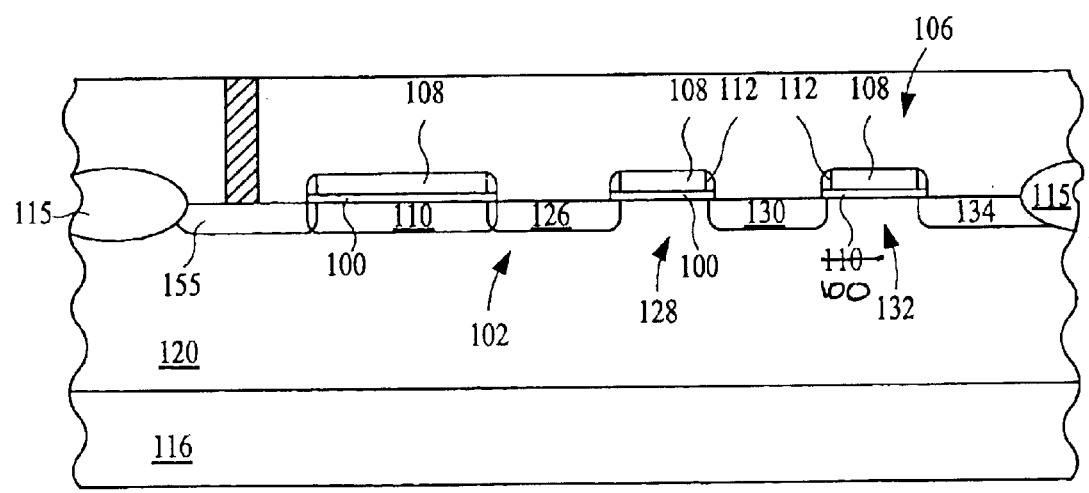
FIG. 10 shows the wafer of FIG. 6 at a processing step subsequent to that shown in FIG. 9.

Reference is now made to FIG. 10 to show how contact 150 and capacitor 162 are formed. A resist and mask (not shown) are applied to the insulating layer 106 and photolithographic techniques are used to define the area to be etched out to form holes for contact 150 to the fourth doped layer 155. This etching may be done at the same time as the etching for the contact holes for the photogate, reset gate and transfer gate contacts as described above The contact 150 may be formed in the etched hole by depositing therein a conductive material, such as doped polysilicon, or a metal such as titanium/titanium nitride/tungsten.

Figure 11:
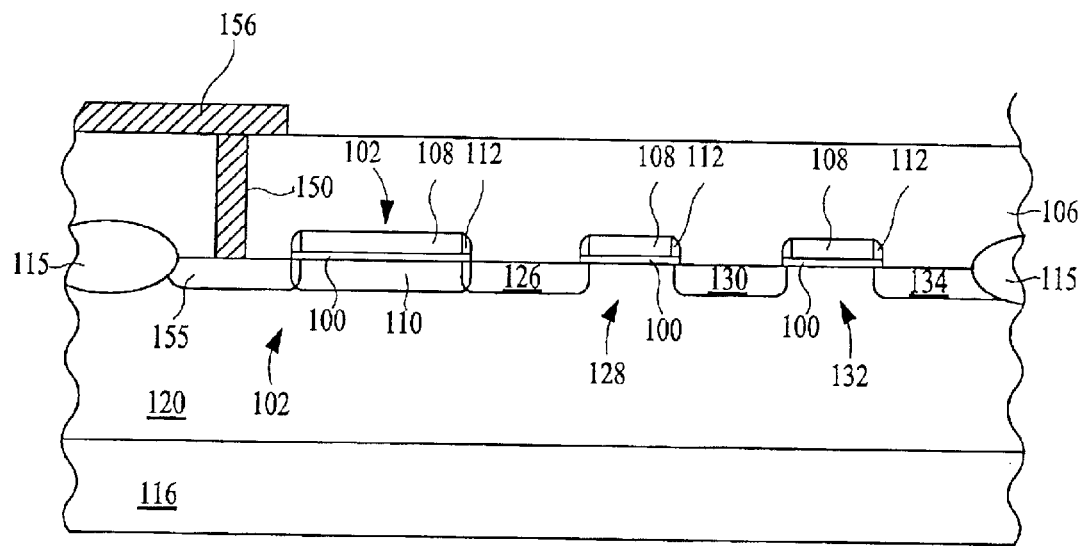
FIG. 11 shows the wafer of FIG. 6 at a processing step subsequent to that shown in FIG. 10.

Reference is now made to FIG. 11. After the etched hole has conductor 150 formed therein a first conductive layer 156, which forms a first electrode of the capacitor 162, is deposited over the insulating layer 106 after application of a resist and mask (not shown). The term electrode, as used herein, shall be understood to mean any material that is electrically conducting. The conductive layer 156 may be formed of any conductive material. Non-limiting examples of materials that may be used to form the conductive layer 156 are doped polycrystalline silicon (referred to herein as polysilicon or poly), platinum, tungsten, TiN, refractory metals, $RuO_2$, Ir, $IrO_2$, Rh, $RhO_x$, and alloys, such as Pt—Ru or Pt—Rh. The conductive layer 156 may be formed on the insulating layer 106 by CVD, LPCVD, PECVD, MOCVD, sputtering or other suitable deposition techniques. The conductive layer 156 formed during deposition which overlies the photogate is next removed from the insulating layer 106 by known techniques, such as wet or dry etching.

Figure 12:
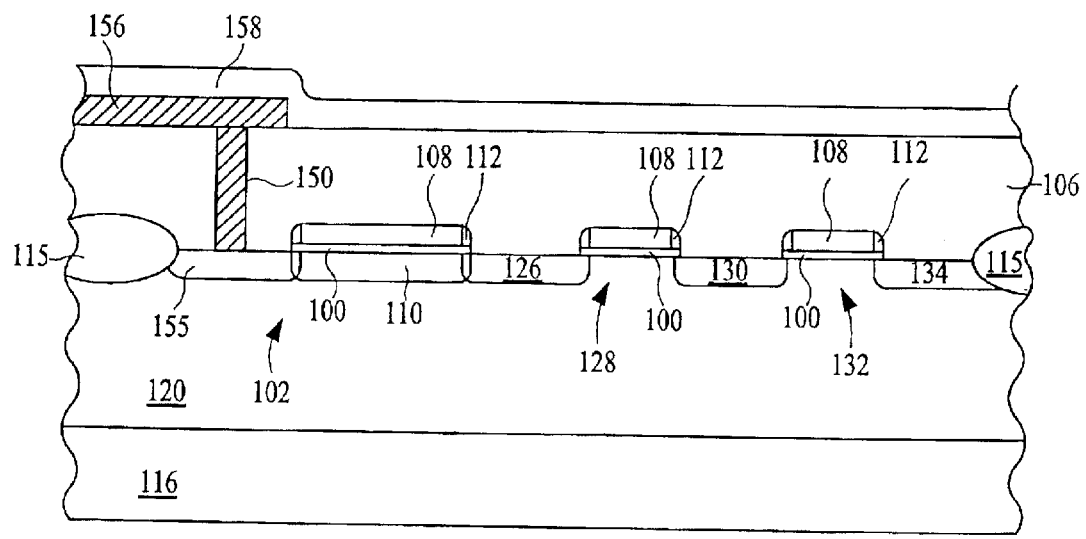
FIG. 12 shows the wafer of FIG. 6 at a processing step subsequent to that shown in FIG. 11.

Reference is now made to FIG. 12. A dielectric layer 158 is formed over conductive layer 156. The term dielectric or insulator as used herein shall be understood to mean any solid, liquid or gaseous material that can sustain an electrical field for use in the capacitor of an integrated circuit device containing a capacitor. The dielectric layer 158 may be formed of any insulating material such as oxides, such as silicon oxide, nitrides, such as silicon nitride, ONO, NO (nitride oxide), ON (oxide nitride), high-k dielectrics such as $Ta_2O_5$ or BST, ferroelectrics or the like. The preferred dielectric layer is a nitride layer which can be formed using various known methods such as CVD deposition, rapid thermal nitridation (RTN) processing or the like.

Figure 13:
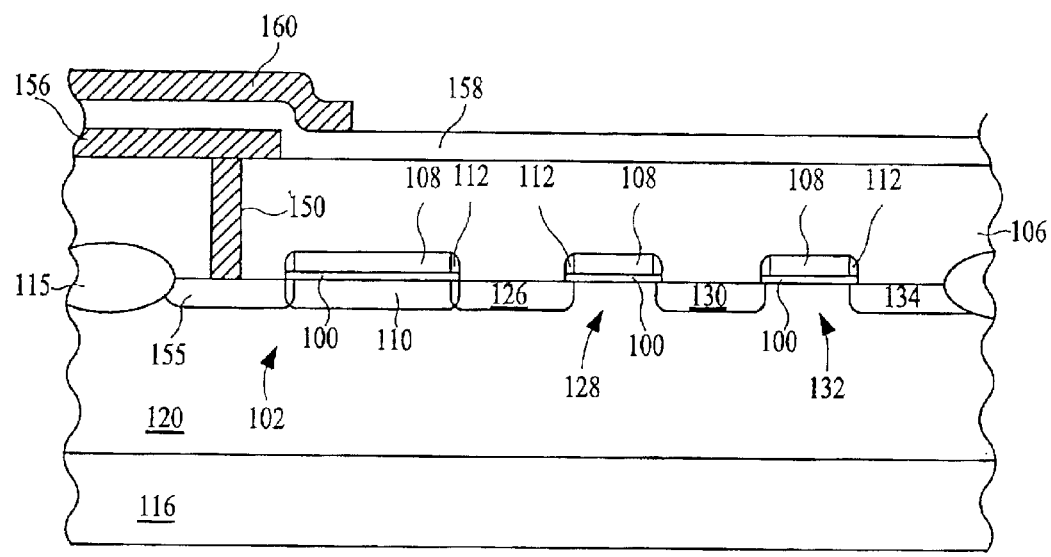
FIG. 13 shows the wafer of FIG. 6 at a processing step subsequent to that shown in FIG. 12.
Figure 14:
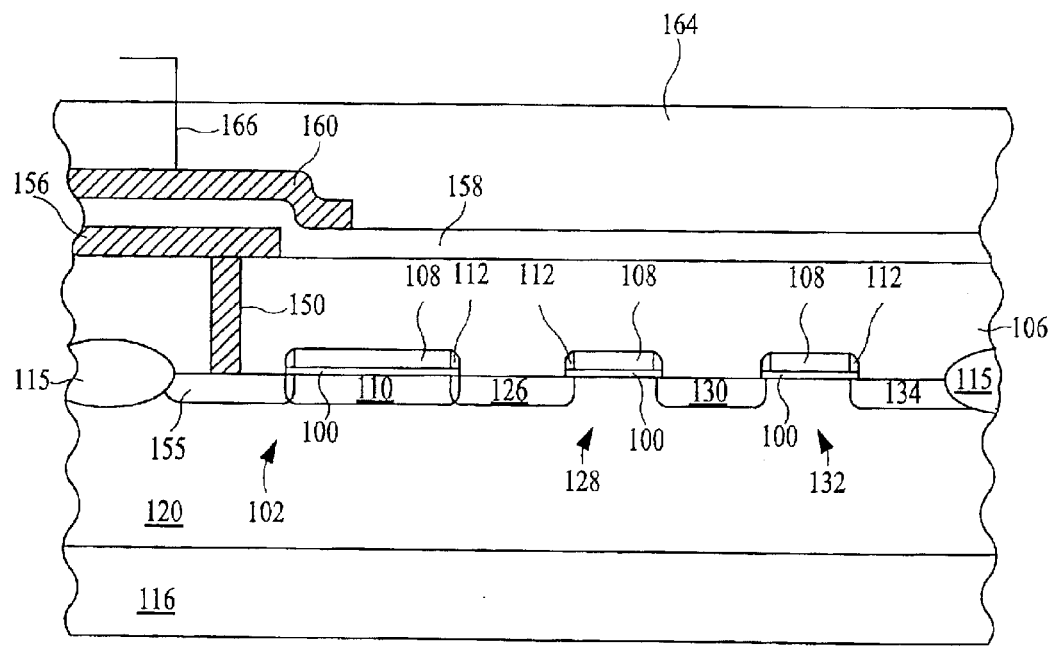
FIG. 14 shows the wafer of FIG. 6 at a processing step subsequent to that shown in FIG. 13.

Reference is now made to FIG. 13. A second conductive layer 160, which forms the second electrode of the capacitor 162, is patterned and formed over the dielectric layer 158 in a method similar to that of the first conductive layer 156. The second conductive layer 160 may be formed of the same or difference conductive materials from those used for the first conductive layer 156. Preferably, both the first and second conductive layers are formed of doped polysilicon with a nitride dielectric layer 158 formed between the two conductive layers 156, 160. A passivation layer 164 is then deposited over the capacitor 162 as shown in FIG. 14. The passivation layer 164 may be any material, such as USG, BPSG, PSG, BSG, provided that the material does not interfere with the collection of light in the photoarea. A hole is etched and a metal contact 166 is formed therein in the passivation layer 164 to connect the second electrode 160 of the capacitor 162 to an electrical circuit, e.g., a ground source potential. As set forth above, the storage capacitor 162 may be formed over any non-photosensitive area of the pixel cell 114. For example, the storage capacitor 162 may be formed over the transfer transistor 128, the reset transistor 132, the source follower transistor 136 or the row select transistor 138.

It should be understood that fabrication of the FIG. 5 structure is not limited to the methods described with reference to the attached figures. For example, the doped regions 110, 126, 130, 134 and 155 may be formed in the doped layer 120 after the transistor gates 102, 128, 132 are formed over the substrate, as discussed below, by masking the transistor gates 102, 128 and 132 and forming the doped regions 110, 126, 130, 134 and 155 in the doped layer 120 so as to form self-aligned gates. Additionally, the first conductive layer 156, the dielectric layer 158 and the second conductive layer 160 may be deposited together and over the entire substrate and then etched away to form capacitor 162.

Figure 15:
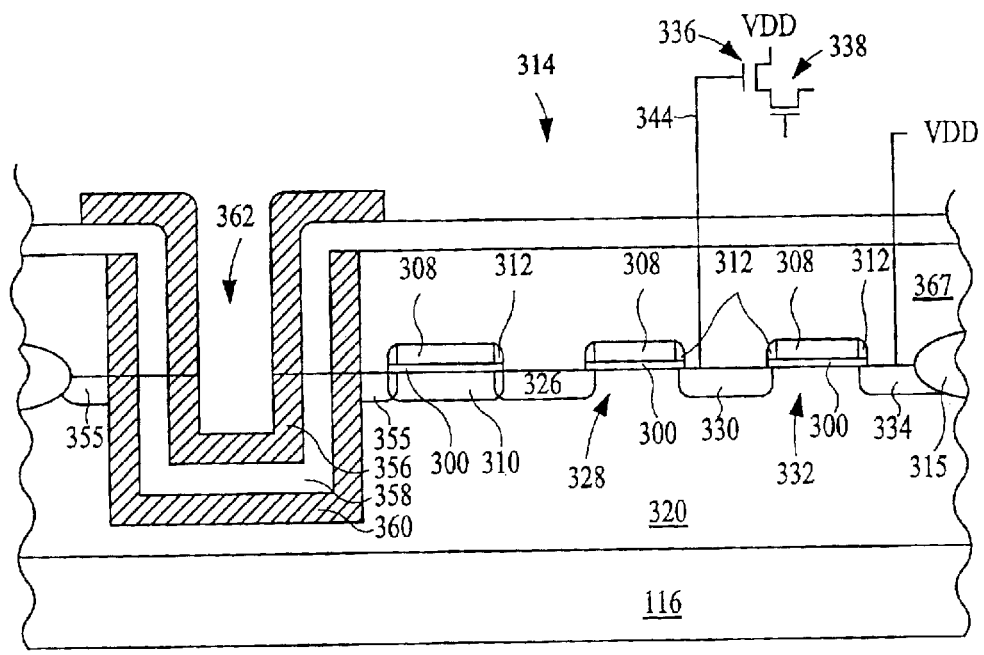
FIG. 15 is a cross-sectional view of a pixel sensor according to another embodiment of the present invention.

The structure of a pixel cell of a second embodiment of the present invention is shown in FIG. 15. The pixel cell 314 may be formed in a substrate 316 having a doped layer 320 of a first conductivity type, which for exemplary purposes is treated as a p-type substrate. A field oxide layer 315, which serves to surround and isolate the cells may be formed by thermal oxidation of the doped layer 320, or by chemical vapor deposition of an oxide material. The doped layer 320 is provided with five doped regions 310, 326, 330, 334 and 355, which are doped to a second conductivity type. For exemplary purposes regions 326, 330, 334, and 355 are treated as n+type. The first doped region 310 is formed under photogate 302 to collect charge and may also be doped n+.

Second doped region 326 serves to electrically connect the photosite diffusion 310 to the transfer gate transistor 322. An insulating layer 300 of silicon dioxide, silicon nitride, or other suitable material is formed between the photogate 302 and the photosensitive diffusion 310, and extends to the pixel-isolating field oxide region 315 and over a surface of the doped layer 320 of the substrate 316.

The third doped region 330 is the floating diffusion region, sometimes also referred to as a floating diffusion node. The floating diffusion region 330 is connected to source follower transistor 336 by a diffusion contact line 344 which is typically a metal contact line. The source follower transistor 336 outputs the charge accumulated in region 326 via the floating diffusion region 330 and diffusion contact line 344 via transistor 338 to a readout circuit as discussed above.

The fourth doped region 334 is the drain of the reset transistor 332, and is also connected to voltage source VDD. The pixel cell thus far described with reference with FIG. 15 operates in a manner similar to the pixel cell described above with reference to FIGS. 1–4 in terms of collecting and reading out charges to the readout circuit 60. In addition, FIG. 15 shows a fifth doped region 355 which is formed adjacent to the photogate 302 and serves to transport charge to a trench storage capacitor 362 from the photosensitive area under the photogate.

Figure 16:
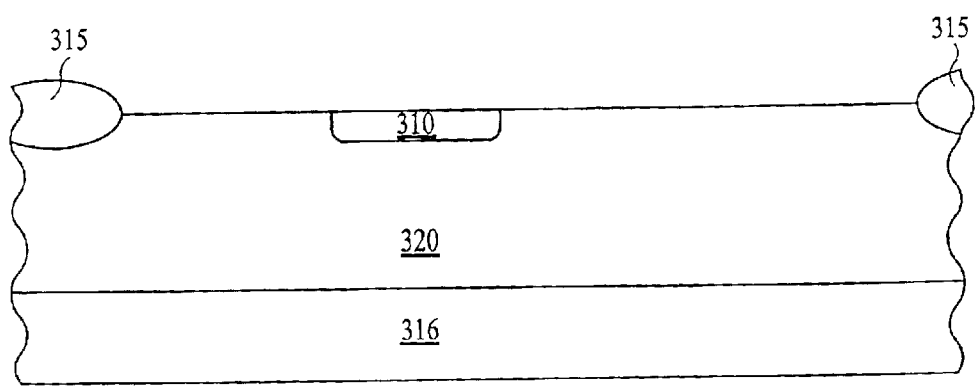
FIG. 16 is a cross-sectional view of a semiconductor wafer according to FIG. 15 undergoing the process of an embodiment of the invention.

The trench storage capacitor 362 is formed in the substrate 316. The trench storage capacitor 362 is formed of a first electrode 356 and a second electrode 360 with a dielectric layer 358 therebetween. The second electrode 360 is preferably connected to a ground source. The trench storage capacitor 362 is formed in the pixel cell 314 such that it takes up as little area of the photocollection area as possible. The CMOS imager of the invention is manufactured by a process described as follows, and illustrated by FIGS. 16 through 22. Referring now to FIG. 16, substrate 316, which may be any of the types of substrates described above, is doped to form a doped substrate layer 320 of a first conductivity type, which for exemplary purposes will be described as p-type. The substrate layer 320 is masked and doped region 310 is formed in the substrate 320. Any suitable doping process may be used, such as ion implantation.

Figure 17:
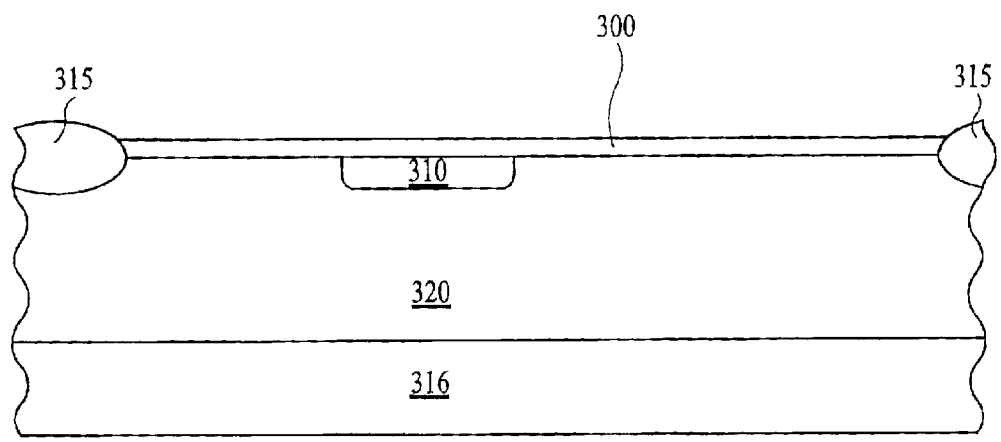
FIG. 17 shows the wafer of FIG. 16 at a processing step subsequent to that shown in FIG. 16.

Referring now to FIG. 17, an insulating layer 300 is now formed over the substrate 316 by thermal growth or chemical vapor deposition, or other suitable means. The insulating layer 300 may be of silicon dioxide, silicon nitride, or other suitable insulating material, and has a thickness of approximately 2 to 100 nm. It is formed to completely cover the substrate 316, and to extend to the field oxide layer 315.

Figure 18:
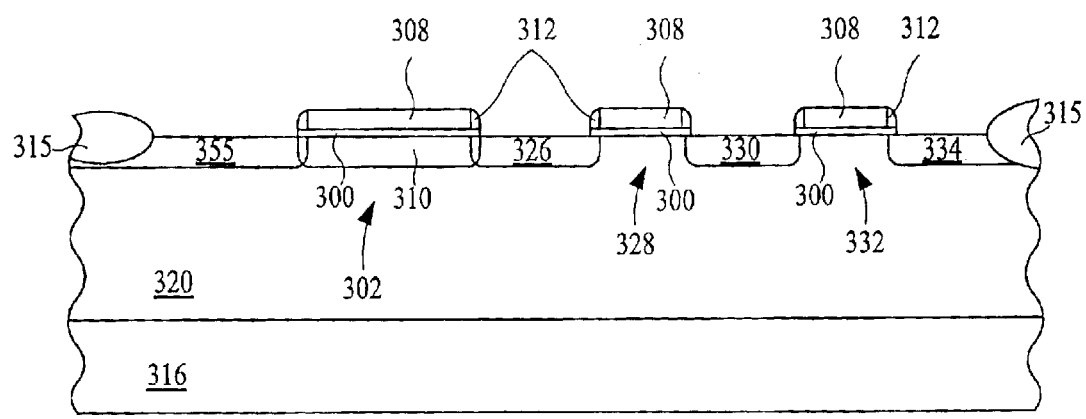
FIG. 18 shows the wafer of FIG. 16 at a processing step subsequent to that shown in FIG. 17.

Referring now to FIG. 18, the transfer gate stack 328, reset transistor gate stack 332, and photogate 302 are now formed. The photogate 302 includes silicon dioxide or silicon nitride insulator 300 on the doped layer 320 and a conductive layer 308 over the insulating layer. Conductive layer 308 is formed of a doped polysilicon or other transparent conductors. The thickness of the conductive layer 308 in photogate 302 may be any suitable thickness, e.g., approximately 200 to 5000 Angstroms.

Conductive layers 308 in gates 328 and 332 may be formed of doped polysilicon, a refractory metal silicide such as tungsten, tantalum, or titanium silicides or other suitable materials such as a barrier/metal. The conductive material is formed by CVD or other suitable means. A silicide or barrier/metal layer (not shown) may be used as part of the polysilicon layer, if desired. The gate stacks may be formed by applying layers 308 (and a silicide layer, if used) over the substrate and then etching them to form gate stacks 302, 328 and 332. Insulating sidewalls 312 are also formed on the sides of the gate stacks 302, 328, 332. These sidewalls may be formed of, for example, silicon dioxide, silicon nitride, or ONO. While these gate stacks may be formed before or after the process of the photogate 302 described below, for exemplary purposes and for convenience the photogate formation has been described as occurring during transistor gate stack formation.

The doped regions 326, 330, 334 and 355 are then formed in the doped layer 320. Any suitable doping process may be used, such as ion implantation. A resist and mask (not shown) are used to shield areas of the layer 320 that are not to be doped. Four doped regions are formed in this step: doped region 326, which forms a transfer region; doped region which is floating diffusion region 330 (which connects to the source follower transistor 336 by contact 344 as shown in FIG. 15); doped region which is a drain region 334; and doped region 355 which connects the photocollection area with the trench storage capacitor 362. The doped regions 326, 330, 334 and 355 are doped to a second conductivity type, which again for exemplary purposes will be considered to be n-type. Preferably, the doped regions 326, 330, 334 and 355 are heavily n-doped with arsenic, antimony or phosphorous at a dopant concentration level of from about $1\times10^{15}$ ions/cm$^2$ to about $1\times10^{16}$ ions/cm$^2$.

Figure 19:
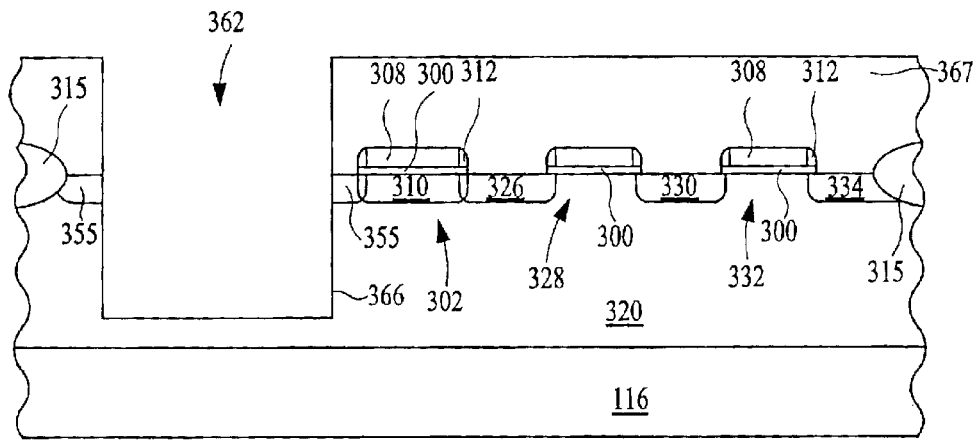
FIG. 19 shows the wafer of FIG. 16 at a processing step subsequent to that shown in FIG. 18.

Reference is now made to FIG. 19. An insulating layer 367 e.g., silicon dioxide or BPSG, which is CMP planarized, is formed over the device. A trench 366 is next formed in the insulating layer 367 and doped layer 320. A resist and mask (not shown) are applied, and photolithographic techniques are used to define the area to be etched-out. A directional etching process such as Reactive Ion Etching (RIE), or etching with a preferential anisotropic etchant is used to etch into the doped layer 320 to a sufficient depth, e.g., about 200 to 2000 nm, to form a trench 366. The depth of the trench 366 should be sufficient to form the trench capacitor 362 of the present invention therein. The resist and mask are removed, leaving a structure that appears as shown in FIG. 19.

Figure 20:
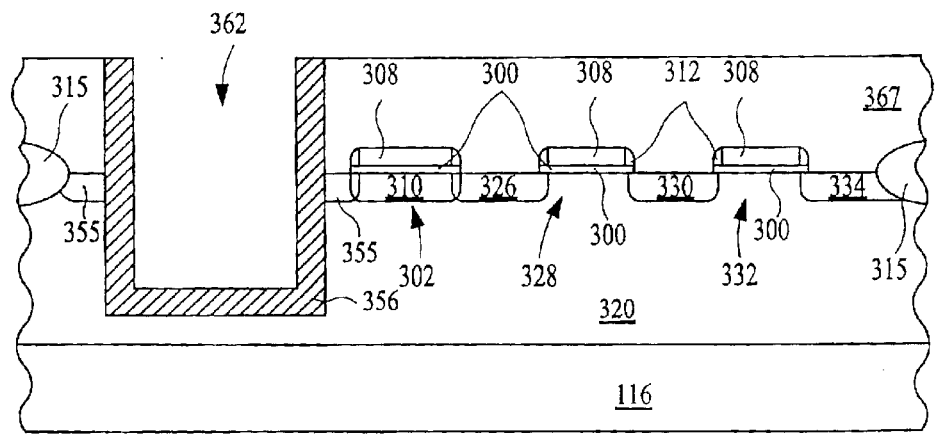
FIG. 20 shows the wafer of FIG. 16 at a processing step subsequent to that shown in FIG. 19.

Reference is now made to FIG. 20. A first conductive layer 356, which forms a first electrode of the capacitor 362, is deposited in the trench 366. The conductive layer 356 may be formed of any conductive material. The conductive layer 356 is coupled to the charge accumulation area under the photogate 302 by fourth doped region 355 by the conductive layer 356 being formed adjacent and in contact with fourth doped region 355. Non-limiting examples of materials that may be used to form the conductive layer 356 are doped polysilicon, platinum, tungsten, TiN, refractory metals, RuO$_2$, Ir, IrO$_2$, Rh, RhO$_x$, and alloys, such as Pt—Ru or Pt—Rh. The conductive layer 356 may be formed in the trench 366 by CVD, LPCVD, PECVD, MOCVD, sputtering or other suitable deposition techniques.

Figure 21:
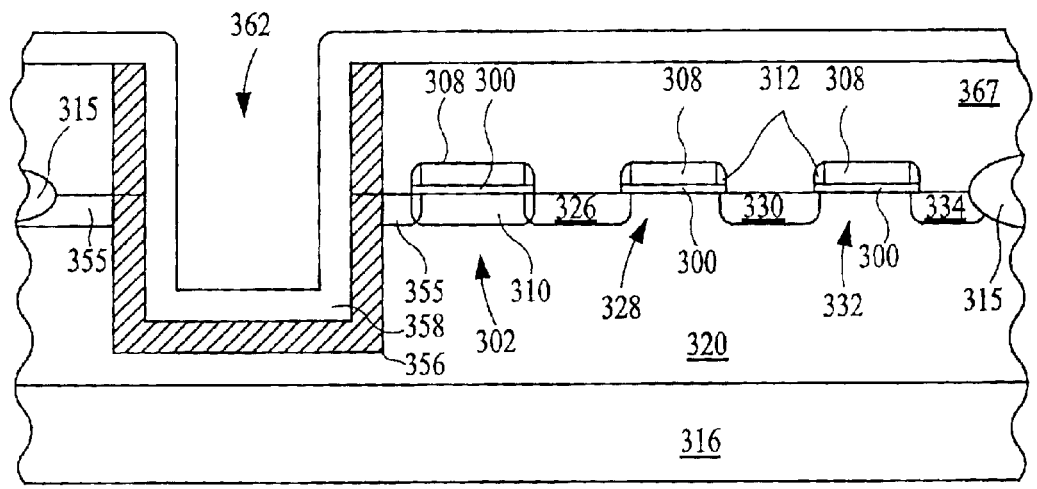
FIG. 21 shows the wafer of FIG. 16 at a processing step subsequent to that shown in FIG. 20.
Figure 22:
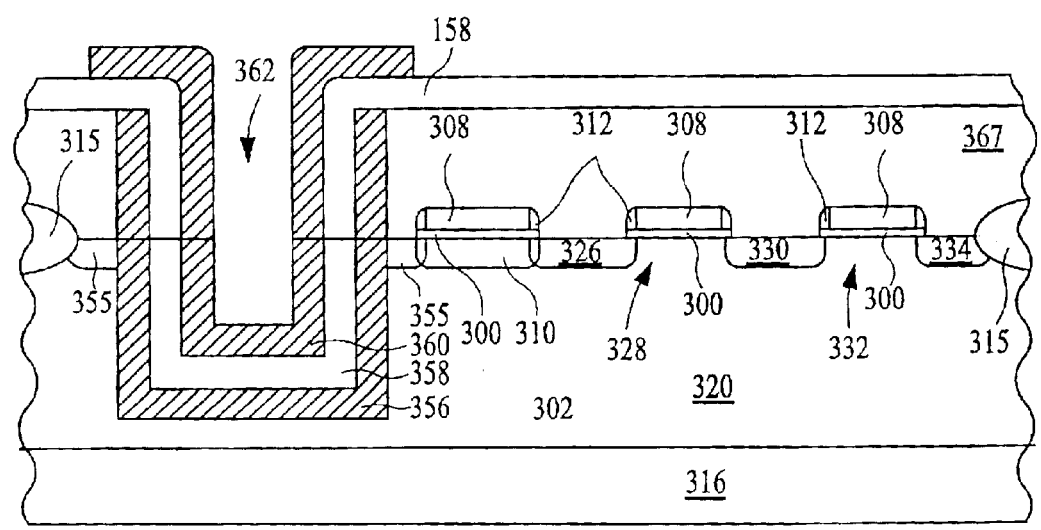
FIG. 22 shows the wafer of FIG. 16 at a processing step subsequent to that shown in FIG. 21.

Reference is now made to FIG. 21. A dielectric layer 358 is formed over conductive layer 356. The dielectric layer 358 may be formed of any insulating material such as oxides, including silicon oxide, nitrides, such as silicon nitride, ONO, NO, ON, high-k dielectrics, such as Ta$_2$O$_5$, BST and ferroelectrics or the like as described above. A second conductive layer 360, which forms the second electrode of the capacitor 362, is formed over the dielectric layer 358 in a method similar to that of the first conductive layer 356, as shown in FIG. 22. The first and second conductive layers 356, 366 may be formed of the same or different materials.

The pixel cell 314 of the second embodiment is essentially complete at this stage, and conventional processing methods may then be used to form contacts and wiring to connect gate lines and other connections in the pixel cell 314. For example, the entire surface may then be covered with an insulating layer of, e.g., silicon dioxide or BPSG, which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

It should be understood that fabrication of the FIG. 15 structure is not limited to the methods described with reference to the attached figures. For example, the doped regions 310, 326, 330, 334 and 355 may be formed in the doped layer 320 after the transistor gates 302, 328, 332 are formed over the substrate, as discussed below, by masking the transistor gates 302, 328 and 332 and forming the doped regions 310, 326, 330, 334 and 355 in the doped layer 320 so as to form self-aligned gates.

A third embodiment of the present invention is described with reference to FIG. 23. It should be understood that similar reference numbers correspond to similar elements as previously described with reference to FIGS. 6–14 and 16–22. The structure set forth in FIG. 23 differs from the above described embodiments in that a stacked storage capacitor 373 is formed in the insulating layer 106 to store charge collected under photogate 102. The processing of the third embodiment is similar to the processing described above with reference to FIGS. 6–9. A hole is etched in the insulating layer 106 down to the fourth doped region 155 and a conductor is formed therein as shown in FIG. 10 to create contact 375; however the etched hole is not fully filled with the conductive material which forms contact 375. The conductor may be formed as a doped polysilicon plug, or as a metallized conductor. A trench 378 is then formed, for example, by etching, in the insulating layer 106 similar to that formed in the substrate as shown in FIG. 19 and a storage capacitor 373 is then formed as described above with reference to FIGS. 19–22. A first conductive layer 376 is formed in the trench 378 which contacts with the fourth doped region 155 through contact 375. A dielectric layer 379 is formed over the first conductive layer 376. A second conductive layer 380 is then formed over the dielectric layer 379 to form the storage capacitor 373. Non-limiting examples of materials that may be used to form the conductive layers 376 and 380 are doped polysilicon, platinum, tungsten, TiN, refractory metals, $RuO_2$, Ir, $IrO_2$, Rh, $RhO_x$, and alloys, such as Pt—Ru or Pt—Rh. The conductive layers 376 and 380 may be formed in the trench 366 by CVD, LPCVD, PECVD, MOCVD, sputtering or other suitable deposition techniques. The storage capacitor 373 formed in the insulating layer 106 has the advantages that the storage capacitor 373 is formed in the insulating layer 106 and not in the substrate thereby improving the charge storage capacity of the imager without reducing the size of the photosensitive area.

Figure 23:
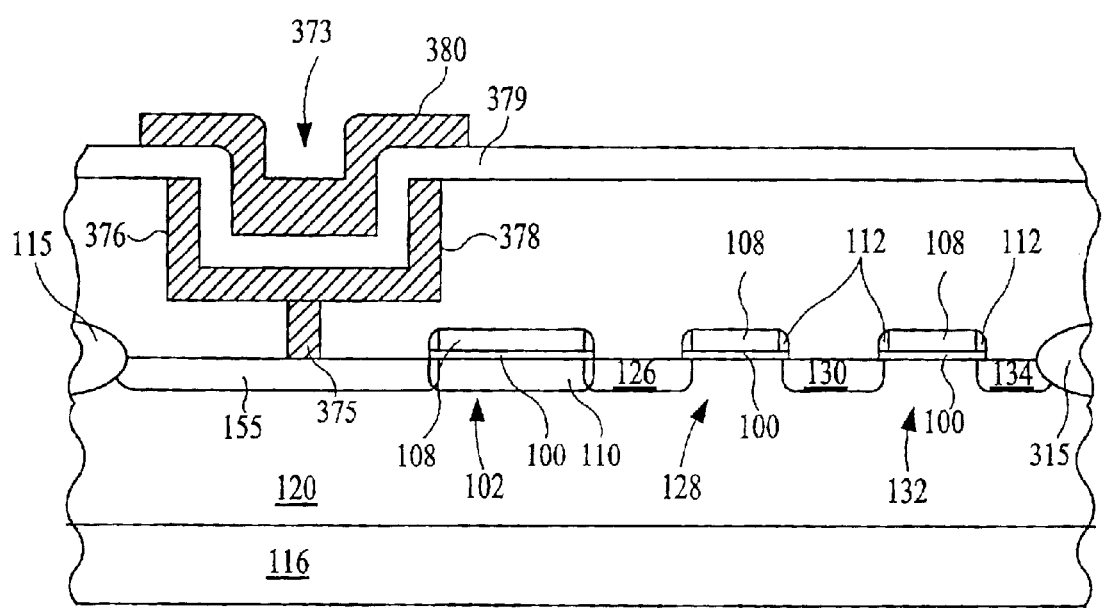
FIG. 23 is a cross-sectional view of a pixel sensor according to another embodiment of the present invention.

It should be understood that while the illustrated embodiments show the storage capacitors 162, 362, 373 connected to the substrate through doped region 155, 355, it is also possible to dispense with region 155, 355 and have the storage capacitors 162, 362, 373 connect directly with region 126 using the same basic structure illustrated in FIGS. 5, 15 and 23.

Figure 24:
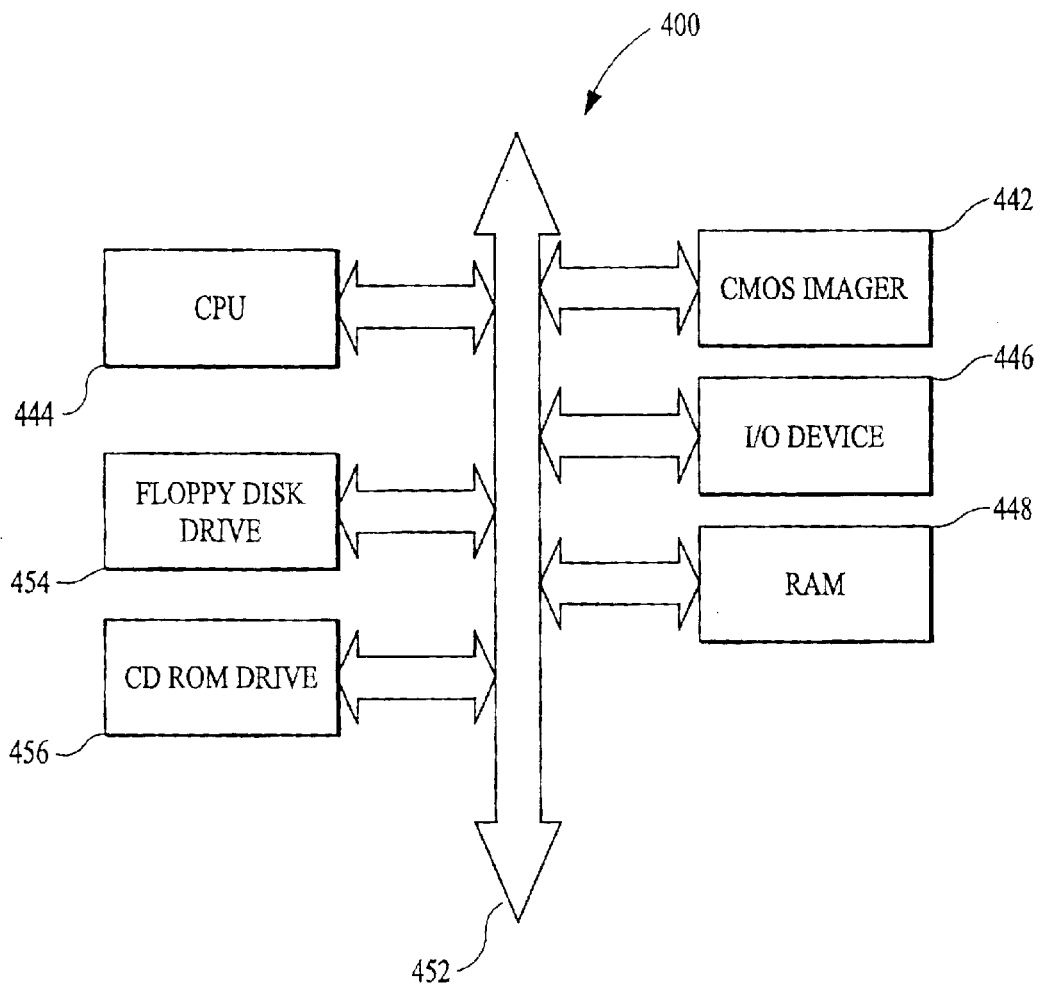
FIG. 24 is an illustration of a computer system having a CMOS imager according to the present invention.

A typical processor based system which includes a CMOS imager device according to the present invention is illustrated generally at 400 in FIG. 24. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444 that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing a photosensor such as a photogate or photodiode formed in a trench, as previously described with respect to FIGS. 5 through 12. The CMOS imager 442 may be combined with a processor, such as a CPU, digital signal processor or microprocessor, in a single integrated circuit.

As can be seen by the embodiments described herein, the present invention encompasses a photosensor including a storage capacitor connected in parallel to the charge collection area of the imager. The imager has an improved charge capacity due to the increase in the charge storage by the capacitor.

It should again be noted that although the invention has been described with specific reference to CMOS imaging circuits having a photogate and a floating diffusion region, the invention has broader applicability and may be used in any CMOS imaging apparatus. Also, although exemplary capacitor structures have been described and illustrated many variations in capacitor structure could be made. Similarly, the processes described above are merely exemplary of many that could be used to produce the invention. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming a CMOS imager having improved charge storage comprising the steps of:
    providing a semiconductor substrate having a doped layer of a first conductivity type;
    forming a first doped region of a second conductivity type in said doped layer, wherein said first doped region is in contact with a charge collection region of a photosensor;
    forming a storage capacitor over said substrate for storing charge accumulated by said charge collection region; and
    forming a contact between said first doped region and said storage capacitor.

2. The method according to claim 1, further comprising:
    forming a second doped region of said second conductivity type in said doped layer spaced from said first doped region to transfer charge from said charge collection area;

forming a third doped region of said second conductivity type in said doped layer spaced from said second doped region wherein said third doped region effectuates the transfer of charge to a readout circuit; and forming a fourth doped region of said second conductivity type in said doped layer spaced from said third doped region wherein said fourth doped region is a drain for a reset transistor for said CMOS imager.

3. The method according to claim 2, wherein the first conductivity type is p-type, and the second conductivity type is n-type.

4. The method according to claim 2, further comprising forming a photogate over said doped layer between said first and second doped regions.

5. The method according to claim 4, further comprising forming a transfer gate over said doped layer between said second and said third doped regions.

6. The method according to claim 2, wherein said first doped region, said second doped region, said third doped region and said fourth doped region are formed by ion implantation.

7. The method according to claim 6, wherein said first doped region, said second doped region, said third doped region and said fourth doped region are doped with dopants selected from the group consisting of arsenic, antimony and phosphorous.

8. The method according to claim 7, wherein the dopant is phosphorus.

9. The method according to claim 2, further comprising forming an insulating layer over said semiconductor substrate.

10. The method according to claim 9, wherein said storage capacitor is formed over said insulating layer and above said second doped region.

11. The method according to claim 9, wherein said storage capacitor is a stacked storage capacitor formed in said insulating layer and said stacked storage capacitor is connected to said first doped region by said contact.

12. The method according to claim 11, wherein said contact is formed of tungsten.

13. The method according to claim 11, wherein said contact is formed of doped polysilicon.

14. The method according to claim 11, wherein said stacked storage capacitor is formed by forming a trench in said insulating layer;

forming a first conductive layer in said trench;

forming an insulating layer over said first conductive layer; and forming a second conductive layer over said insulating layer.

15. The method according to claim 14, wherein said first conductive layer is formed by CVD or sputtering.

16. The method according to claim 14, wherein said first conductive layer is a platinum metal layer, a tungsten metal layer, a titanium nitride layer or a doped polysilicon layer.

17. The method according to claim 14, wherein said insulating layer is formed by CVD.

18. The method according to claim 14, wherein said insulating layer is an oxide layer or a nitride layer.

19. The method according to claim 14, wherein said second conductive layer is formed by CVD or sputtering.

20. The method according to claim 14, wherein said second conductive layer is a platinum metal layer, a tungsten metal layer, a titanium nitride layer or a doped polysilicon layer.

21. The method according to claim 9, wherein said storage capacitor is formed over said insulating layer and said storage capacitor is connected to said first doped region by said contact.

22. The method according to claim 21, wherein said contact is formed of tungsten.

23. The method according to claim 21, wherein said contact is formed of doped polysilicon.

24. The method according to claim 21, wherein said storage capacitor is formed over a field oxide.

25. The method according to claim 21, wherein said storage capacitor is formed by forming a first conductive layer over said insulating layer;

forming an insulating layer over said first conductive layer; and forming a second conductive layer over said insulating layer.

26. The method according to claim 25, wherein said first conductive layer is formed by CVD or sputtering.

27. The method according to claim 25, wherein said first conductive layer is a platinum metal layer, a tungsten metal layer, a titanium nitride layer or a doped polysilicon layer.

28. The method according to claim 25, wherein said insulating layer is formed by CVD.

29. The method according to claim 25, wherein said insulating layer is an oxide layer or a nitride layer.

30. The method according to claim 25, wherein said second conductive layer is a formed by CVD or sputtering.

31. The method according to claim 25, wherein said second conductive layer is a platinum metal layer, a tungsten metal layer, a titanium nitride layer or a doped polysilicon layer.

32. The method according to claim 25, further comprising etching the excess layers of said storage capacitor from said insulating layer.

33. A method of forming a CMOS imager having improved charge storage comprising the steps of:

providing a semiconductor substrate having a doped layer of a first conductivity type;

providing a photoconversion device in said semiconductor substrate for accumulating photogenerated charge, said photoconversion device comprising a light sensitive area;

forming a first doped region of a second conductivity type in said doped layer and adjacent said photoconversion device;

forming a trench in said doped layer adjacent to said first doped region;

forming a first conductive layer in said trench;

forming an insulating layer over said first conductive layer in said trench; and forming a second conductive layer over said insulating layer to form a trench capacitor, wherein said trench capacitor is electrically connected in parallel with said light sensitive area and stores charge accumulated in said photoconversion device.

34. The method according to claim 33, wherein said first conductive layer is formed by CVD or sputtering.

35. The method according to claim 34, wherein said first conductive layer is a platinum metal layer, a tungsten metal layer, a titanium nitride layer or a doped polysilicon layer.

36. The method according to claim 33, wherein said insulating layer is formed by CVD.

37. The method according to claim 36, wherein said insulating layer is an oxide layer or a nitride layer.

38. The method according to claim 33, wherein said second conductive layer is formed by CVD or sputtering.

39. The method according to claim 38, wherein said second conductive layer is a platinum metal layer, a tungsten metal layer, a titanium nitride layer or a doped polysilicon layer.

40. The method according to claim 33, wherein said trench forming step comprises a reactive ion etching process.

41. The method according to claim 40, wherein said trench forming step comprises etching the substrate with a preferential anisotropic etchant.

42. The method according to claim 33, further comprising:
   forming a second doped region of said second conductivity type in said doped layer spaced from said first doped region;
   forming a third doped region of said second conductivity type in said doped layer spaced from said second doped region; and
   forming a fourth doped region of said second conductivity type in said doped layer spaced from said third doped region.

43. The method according to claim 42, wherein the first conductivity type is p-type, and the second conductivity type is n-type.

44. The method according to claim 42, further comprising forming an insulating layer over said semiconductor substrate.

45. The method according to claim 42, further comprising forming a photogate over said doped layer between said first and second doped regions.

46. The method according to claim 45, further comprising forming a transfer gate over said doped layer between said second and said third doped regions.

47. The method according to claim 42, wherein said first doped region, said second doped region, said third doped region and said fourth doped region are formed by ion implantation.

48. The method according to claim 47, wherein said first doped region, said second doped region, said third doped region and said fourth doped region are doped with dopants selected from the group consisting of arsenic, antimony and phosphorous.

49. The method according to claim 48, wherein the dopant is phosphorus.

50. The method according to claim 49, wherein said first doped region, said second doped region, said third doped region and said fourth doped region are doped at a dopant concentration of from about $1 \times 10^{15}$ ions/cm$^2$ to about $1 \times 10^{16}$ ions/cm$^2$.

* * * * *